(12) United States Patent
Wirz et al.

(10) Patent No.: US 12,506,118 B2
(45) Date of Patent: Dec. 23, 2025

(54) PERPENDICULAR SEMICONDUCTOR DEVICE ASSEMBLIES AND ASSOCIATED METHODS

(71) Applicant: Micron Technology, Inc., Boise, ID (US)

(72) Inventors: Brandon P. Wirz, Boise, ID (US); Andrew M. Bayless, Boise, ID (US); Owen R. Fay, Meridian, ID (US); Bang-Ning Hsu, Taichung (TW)

(73) Assignee: Micron Technology, Inc., Boise, ID (US)

( * ) Notice: Subject to any disclaimer, the term of this patent is extended or adjusted under 35 U.S.C. 154(b) by 666 days.

(21) Appl. No.: 17/889,914

(22) Filed: Aug. 17, 2022

(65) Prior Publication Data

US 2024/0063184 A1 Feb. 22, 2024

(51) Int. Cl.
*H01L 25/065* (2023.01)
*H01L 25/00* (2006.01)

(52) U.S. Cl.
CPC ......... *H01L 25/0657* (2013.01); *H01L 25/50* (2013.01); *H01L 2225/06531* (2013.01); *H01L 2225/06534* (2013.01); *H01L 2225/06551* (2013.01); *H01L 2225/06586* (2013.01)

(58) Field of Classification Search
CPC ..... H01L 25/0657; H01L 25/50; H01L 25/117
See application file for complete search history.

(56) References Cited

U.S. PATENT DOCUMENTS

| | | | | |
|---|---|---|---|---|
| 6,329,829 B1 * | 12/2001 | Farnworth | ........... | G01R 1/0483 |
| | | | | 324/762.01 |
| 6,734,538 B1 * | 5/2004 | Sturcken | ............. | H01L 25/0657 |
| | | | | 438/455 |
| 2018/0113969 A1 * | 4/2018 | Chen | ...................... | H01L 25/065 |

* cited by examiner

*Primary Examiner* — Dale E Page
*Assistant Examiner* — Wilner Jean Baptiste
(74) *Attorney, Agent, or Firm* — Dorsey & Whitney LLP

(57) ABSTRACT

A semiconductor device assembly can include an assembly semiconductor die having a top surface with a first and a second assembly communication element thereat. The semiconductor device assembly can further include a semiconductor die stack coupled to the top surface. The die stack can include a first and a second semiconductor die, each having a top surface perpendicular to the top surface of the assembly semiconductor die. Further, the first semiconductor die can have a first die communication element aligned with and configured to directly communicate with the first assembly communication element, and the second semiconductor die can have a second die communication element aligned with and configured to directly communicate with the second assembly communication element.

20 Claims, 13 Drawing Sheets

900

902
Provide a plurality of stack semiconductor dies with a die communication element at a side of each of the stack dies

904
Form a semiconductor die stack using the stack semiconductor dies, with the die communication elements at a first side of the semiconductor die stack

906
Position the semiconductor die stack with each of the die communication elements aligned with an assembly communication element at a top surface of an assembly semiconductor die

908
Couple the semiconductor die stack to the assembly semiconductor die

1002
Provide a plurality of stack semiconductor dies with a die communication element at a side of each of the stack dies 1004
Form a semiconductor die stack using the stack semiconductor dies, with the die communication elements at a first side of the semiconductor die stack 1006
Position the semiconductor die stack on risers with each of the die communication elements aligned with an assembly communication element at a top surface of an assembly semiconductor die 1008
Couple the semiconductor die stack to the assembly semiconductor die

1102
Provide a plurality of stack semiconductor dies with a die communication element at a side of each of the stack dies

1104
Form a semiconductor die stack using the stack semiconductor dies, with the die communication elements at a first side of the semiconductor die stack

1106
Form plated interconnections from the die communication elements

1108
Position the semiconductor die stack with each of the plated interconnections aligned with an assembly communication element at a top surface of an assembly semiconductor die

1110
Couple the semiconductor die stack to the assembly semiconductor die

1202
Provide a plurality of stack semiconductor dies with a die communication element at a side of each of the stack dies

1204
Form a semiconductor die stack using the stack semiconductor dies, with the die communication elements at a first side of the semiconductor die stack

1206
Form plated interconnections from the die communication elements

1208
Form a dielectric material on the first side and around the plated interconnections

1210
Remove portions of the dielectric material and the plated interconnections to form a polished surface

1212
Position the semiconductor die stack with each of the plated interconnections aligned with an assembly communication element at a top surface of an assembly semiconductor die

1214
Couple the semiconductor die stack to the assembly semiconductor die

*FIG. 12*

PERPENDICULAR SEMICONDUCTOR DEVICE ASSEMBLIES AND ASSOCIATED METHODS

TECHNICAL FIELD

The present technology is generally related to semiconductor device assemblies. In particular, the present technology relates to perpendicular semiconductor device stacks included in semiconductor device assemblies.

BACKGROUND

Microelectronic devices, such as memory devices and microprocessors, and other electronics typically include one or more semiconductor devices and/or components attached to a substrate and encased in a protective covering. The devices and/or components include at least one functional feature, such as memory cells, processor circuits, or interconnecting circuitry, etc. Each device and/or component commonly includes an array of small bond pads electrically coupled to the functional features therein for interconnection with other devices and/or components.

Manufacturers are under increasing pressure to reduce the space occupied by these devices and components while simultaneously increasing the capacity and/or speed of operation for the resulting semiconductor device assemblies. One approach taken to reduce space and increase capacity is stacking multiple semiconductor devices and/or components above the substrate. This generally includes bonding a first semiconductor device to the substrate, and then subsequently bonding a second semiconductor device above the first semiconductor device, then a third semiconductor device above the second semiconductor device, and so on. Each semiconductor device can then communicate with the substrate via an interconnection extending from the substrate and through any semiconductor devices therebetween.

BRIEF DESCRIPTION OF THE DRAWINGS

FIGS. 9-12 are flow diagrams illustrating processes for producing semiconductor devices, in accordance with some embodiments of the present technology.

Figure 1:
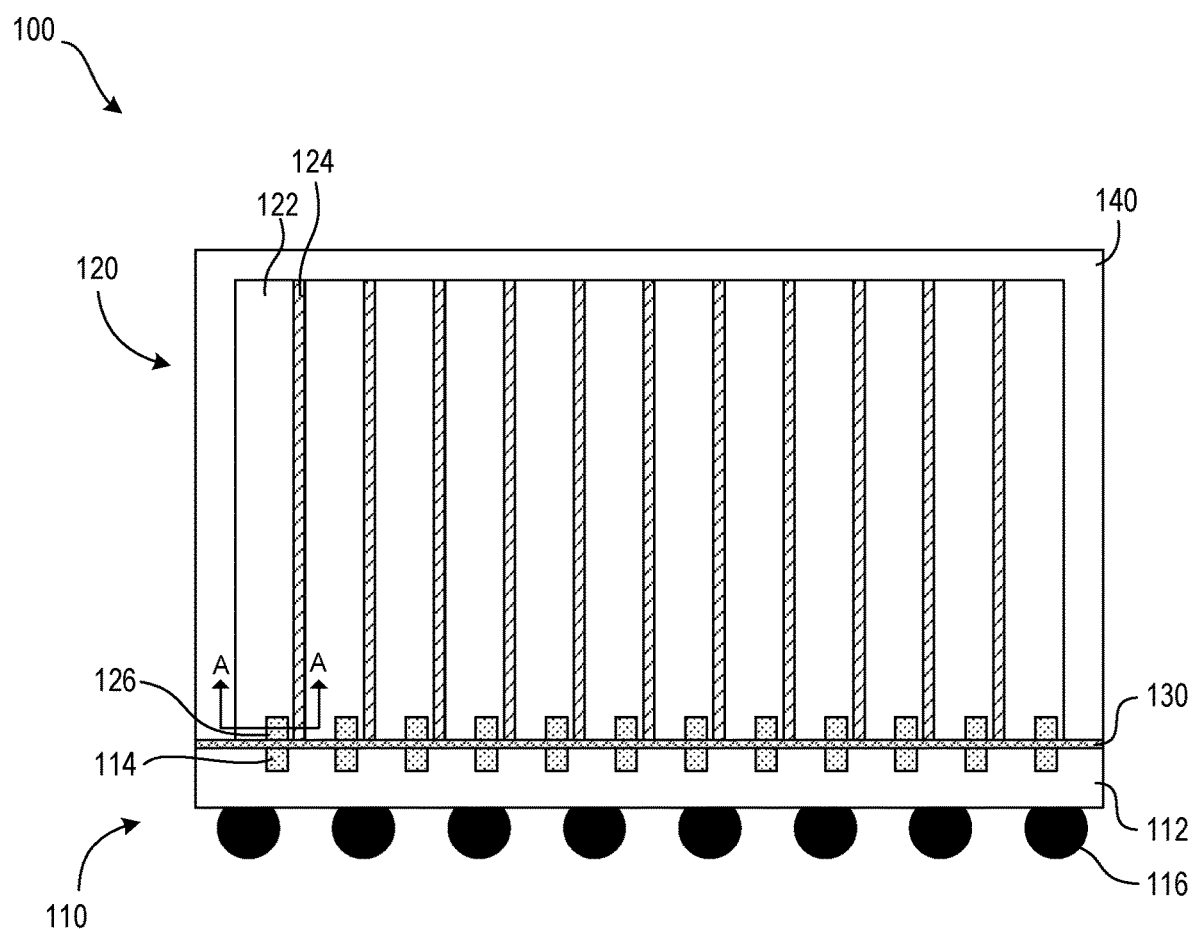
FIG. 1 is a cross-sectional side view of a semiconductor device assembly, configured in accordance with some embodiments of the present technology.

The drawings have not necessarily been drawn to scale. Similarly, some components or operations can be separated into different components or combined into a single assembly in some implementations of the present technology. While the technology is amenable to various modifications and alternative forms, specific implementations have been shown by way of example in the drawings and are described in detail below.

DETAILED DESCRIPTION

Traditionally, semiconductor device packages with stacked devices therein include a package or assembly device with a stack of multiple devices thereon. In these packages, the width of the base package device and the widths of the devices stacked thereon are all parallel. Tall stacks of devices over the package substrate present particular challenges for heat dissipation and can only be implemented for certain applications. First, heat generated by the device stack must largely dissipate through the top of the device stack (e.g., 60%, 70%, 80%, 90%, or 95% of heat generated) because systems where the semiconductor devices packages are implemented have lateral heat dissipation limitations imposed by adjacent components. This therefore requires large thermal dissipating elements (e.g., thermal conduits) to extend along the height of the device stack and through each device. These elements occupy space that could otherwise be used for functional features within the devices. Second, devices stacks can only be implemented for assemblies including devices that can be connected in parallel, such as memory devices. Therefore the benefits of traditional stacked devices can only be realized for a subset of semiconductor device assemblies.

Aspects of including perpendicular semiconductor device stacks (e.g., the device stack 120 of FIG. 1, 300 of FIG. 3, 500 of FIG. 5, 700 of FIG. 7) in semiconductor device assemblies (e.g., the assembly 100 of FIG. 1, 400 of FIG. 4, 600 of FIG. 6, 800 of FIG. 8), as implemented by the present technology, can alleviate the above-noted deficiencies as well as provide many additional benefits over traditionally stacked semiconductor device assemblies. For example, semiconductor device assemblies with perpendicular semiconductor devices can provide superior heat dissipation over traditional semiconductor device assemblies. When device stacks are perpendicular, a portion of each stack device is at the top of the assembly and can dissipate heat therefrom, as opposed to including a thermal conduit extending through multiple devices.

As a further example, semiconductor device assemblies with perpendicular semiconductor devices can allow for direct connections between each stack device and the package or assembly device. Because each stack device can communication directly with the package or assembly device, stack devices are no longer bound to parallel-only interconnections, allowing for including memory as well as processing and/or controller devices. Additionally, direct communication can improve stack-to-assembly device signaling by reducing or eliminating interconnection distances (e.g., portions of interconnections that would pass along the height of the traditional semiconductor device stacks).

At least one embodiment of a semiconductor device assembly with a perpendicular semiconductor device stack can include an assembly semiconductor die having a top surface with a first and a second assembly communication element thereat. The semiconductor device assembly can further include a semiconductor die stack coupled to the top surface. The die stack can include a first and a second semiconductor die, each having a top surface perpendicular to the top surface of the assembly semiconductor die. Further, the first semiconductor die can have a first die communication element aligned with and configured to directly communicate with the first assembly communication element, and the second semiconductor die can have a second die communication element aligned with and configured to directly communicate with the second assembly communication element.

In some embodiments, a semiconductor die of the semiconductor device assembly, alone, can include a die substrate having a top surface and a side surface perpendicular to the top surface. The semiconductor die can include a semiconductor component within the die substrate, and can include a first communication element exposed at the side surface and in electric communication with the semiconductor component. The first communication element can be configured to communicate with a corresponding, first opposing communication element, and can be an inductor, an optical element, or a bond pad.

The above semiconductor device assembly can be manufactured by providing a plurality of stack semiconductor dies with a die communication element at a side of each of the stack semiconductor dies. The plurality of stack semiconductor dies can be formed into a semiconductor die stack with the die communication elements at a first side thereof. The semiconductor die stack can be positioned with each of the die communication elements aligned with an assembly communication element at a top surface of an assembly semiconductor, and the semiconductor die stack can be coupled to the assembly semiconductor die. Once the semiconductor die stack is coupled to the assembly semiconductor die, each of the die communication elements can be in direct communication with the corresponding assembly communication element aligned therewith.

For ease of reference, the semiconductor device and other components are sometimes described herein with reference to top, bottom, left, right, lateral, vertical, uppermost, lowermost, or other similar directional terms relative to the spatial orientation of the embodiments described and/or shown in the figures. The semiconductor devices described herein and modifications thereof can be moved to and/or used in different spatial orientations without changing the structure and/or function of the disclosed embodiments of the present technology.

FIG. 1 is a cross-sectional side view of a semiconductor device assembly 100 including a perpendicular semiconductor device stack 120, configured in accordance with some embodiments of the present technology. The assembly 100 can be a first example of a semiconductor device assembly including a perpendicular semiconductor device stack. However, some or all aspects of the assembly 100, and the elements and/or benefits thereof, can correspond with other examples of semiconductor device assemblies including a perpendicular semiconductor device stack.

Referencing FIG. 1, the assembly 100 can include the device stack 120 coupled to an assembly device 110 by an adhesive 130 (e.g., adhesive layer) and encased (e.g., covered, overmolded) by a mold material 140. The assembly device 110 can include an assembly substrate 112 with one or more assembly communication elements 114 and one or more solder balls 116. The assembly communication elements 114 can be in electric communication with one or more components (e.g., functional features) within the assembly device 110.

The device stack 120 can include one or more semiconductor stack devices 122 (e.g., semiconductor dies, stack dies) laterally coupled together by adhesives 124 (e.g., adhesive layers) between consecutive stack devices 122. One or more of the stack devices 122 can each include a device communication element 126 at a side (e.g., side edge; bottom side, as shown) thereof and vertically aligned with and adjacent to one of the assembly communication elements 114 (e.g., corresponding assembly communication elements 114). The device communication element 126 can be in electric communication with one or more components within the stack device 122. In some embodiments, one or more (or all) of the adhesives 124 can be replaced with a dielectric material bonding the stack devices 122 together. For example, such dielectric material can include spin on dielectric material, TEOS, SiN, SiO, SiCN, or any similar, suitable dielectric material capable of bonding devices together.

As illustrated in FIG. 1, an as-formed width of each stack device 122 (e.g., along internal component layers; a height, as shown) can be perpendicular to an as-formed width of the assembly device 110 (e.g., as shown). In this arrangement, the device stack 120 can be coupled to the assembly device 110 with one or more (or all) of the device communication elements 126 each vertically aligned with the corresponding assembly communication element 114 (corresponding assembly and device communication elements 114, 126 are referred to as a "communication elements pair 114, 126").

By vertically aligning the communication elements pair 114, 126, one or more components of the stack devices 122 can communicate with one or more (i) components of the assembly device 110, (ii) components of other stack devices 122, and/or (iii) components external to the assembly 100. The components of the stack devices 122 can communicate with one or more of these elements via (i) one or more of the communication elements pairs 114, 126; (ii) the assembly device 110 (e.g., via a first communication elements pair 114, 126, the assembly device 110, and a second communication elements pair 114, 126); and/or (iii) the solder balls 116 (e.g., via a first communication elements pair 114, 126, the assembly device 110, and the solder balls 116). Further, communication between adjacent stack devices 122 can occur through a top and/or bottom surface (e.g., left and/or right side, as shown) thereof.

The assembly device 110 and the stack devices 122 can each be a memory and/or a processing device, such as a memory die, a graphics processing unit, a logic device, an interposer, a PCB, or any similar semiconductor device with internal and/or external components (e.g., functional features). Further, because each stack device 122 can be directly connected to the assembly device 110, the stack device 122 can itself include memory and process components combine (e.g., device components otherwise requiring parallel interconnection). In some embodiments, the assembly device 110 can be a processing device and the stack devices 122 can be memory components supporting operations of the assembly device 110. Although as illustrated, the assembly 100 includes twelve stack devices 122, in some embodiments, the assembly 100 can include as few as one stack device 122, between one and twelve stack devices 122, or more than twelve stack devices 122 (e.g., 13, 15, 20, 50, 100, 200, or any specific value or range outside or therebetween). Similarly, although as illustrated, the assembly 100 includes one device stack 120, in some embodiments, the assembly 100 can include one or more additional device stacks 120 (e.g., 1, 2, 5, 10, or any specific value or range outside or therebetween) each individually arranged in parallel with and/or perpendicular to (or any angle therebetween) the device stack 120 of FIG. 1.

The adhesive 130 can be any suitable adhesive layer coupling the device stack 120 to the assembly device 110. For example, the adhesive 130 can be an adhesive material provided by an additive manufacturing process (e.g., a material deposited, sprayed, and/or applied), a die adhesive film (DAF), non-conductive paste (NCP), non-conductive film (NCF), and/or any similar suitable adhesive. In some embodiments, the adhesive 130 can be replaced with a dielectric material bonding the device stack 120 to the assembly device. For example, such dielectric material can include spin on dielectric material, TEOS, SiN, SiO, SiCN, or any similar, suitable dielectric material capable of bonding devices together.

The mold material 140 can be any suitable mold material suitable for encasing the device stack 120 and/or the assembly device 110, and protecting the assembly 100 against contaminants (e.g., dust, dirt, liquid, smoke, etc.). The solder balls 116 can be any suitable solder material configured to provide physical and/or electrical connects with one or more devices external to the assembly 100.

Aspects of including perpendicular semiconductor device stacks (e.g., the device stack 120) in semiconductor device assemblies (e.g., the assembly 100), as implemented by the present technology, can provide many benefits over traditionally stacked semiconductor device assemblies. For example, because each stack device is exposed at a top of the assemblies, heat can dissipate directly from the stack devices and away from the assemblies. This eliminates the need for a thermal conduit extending along the height of a traditional device stack and occupying space otherwise useable for functional features. Additionally, because each stack device is directly connected to the top surface of the assembly device, a wider variety of devices can be included in a device stack and device-to-assembly signaling can be improved.

Figure 2A:
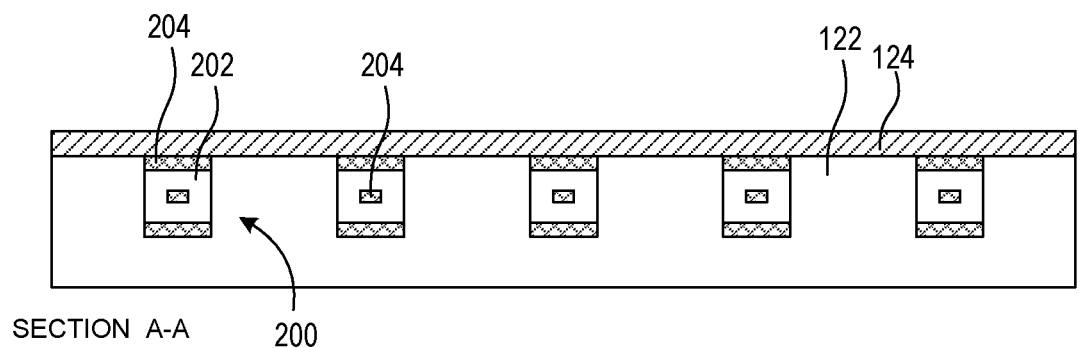
FIG. 2A is a cross-sectional bottom view of a semiconductor device, configured in accordance with some embodiments of the present technology.
Figure 2B:
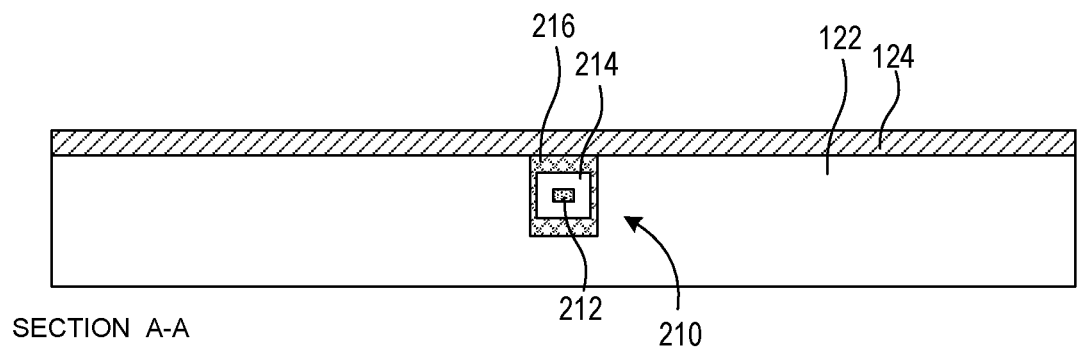
FIG. 2B is a cross-sectional bottom view of a semiconductor device, configured in accordance with some embodiments of the present technology.

FIGS. 2A and 2B are cross-sectional bottom views of the stack device 122 of the first example at the cross section A-A of FIG. 1, configured in accordance with some embodiments of the present technology. More specifically, FIG. 2A illustrates a first configuration of the stack device 122 with device inductors 200 implemented as the device communication elements 126 of FIG. 1. FIG. 2B illustrates a second configuration of the stack device 122 with a device optical element 210 implemented as the device communication element 126 of FIG. 1.

Referencing FIG. 2A, one or more device inductors 200 can be at the side of the stack device 122. For example, the stack device 122 can include one or more device inductors 200 (or, generally, one or more device communication elements 126 of FIG. 1) laterally spaced along a length of the stack device 122 (e.g., into and/or out of the view-plane of FIG. 1). The device inductors 200 can include one or more layers of conductive material 202 and/or dielectric material 204 to form an induction assembly (e.g., an inductor coil). An axis of each of the device inductors 200 (e.g., along a centerline of the inductor coil; normal with the view-plane of FIG. 2B as shown) can be parallel or perpendicular (or any angle therebetween) with the side of the stack device 122. The device inductors 200 can be in electric communication with one or more components within the stack device 122 via traces within the stack device 122.

In some embodiments, the stack device 122 can include one or more bond pads at the top surface (e.g., at the interface of the stack device 122 and the adhesive 124, as shown) and in electric communication with one or more components within the stack device 122. In these embodiments, the device inductors 200 can, additionally or alternatively, be in electric communication with the one or more bond pads at the top surface via a trace (e.g., a metallic strip) extending along the top surface of the stack device 122 between the device inductor 200 and one or more of the bond pads. In some embodiments, the induction assembly of one or more device inductors 200 can be a trace along (and/or within) the side of the stack device 122. In some embodiments, one or more of the device inductors 200 can be at, extending from, or on the top surface of the stack device 122.

When the stack devices 122 include the device inductors 200, one or more assembly communication elements 114 of FIG. 1 corresponding with one of the device inductors 200 (e.g., corresponding with the device communication elements 126 of FIG. 1) can be implemented as an assembly inductor. The assembly inductors, like the device inductors 200, can each include one or more layers of conductive material and/or dielectric material to form an induction assembly, and can each include an axis parallel or perpendicular (or any angle therebetween) with a top surface of the assembly substrate 112 of the assembly device 110. In some embodiments, the induction assembly of one or more assembly inductors can be a trace along (and/or within) the top surface of the assembly device 110.

The device inductors 200 can facilitate communication between the stack device 122 and the assembly device 110 via a pair of corresponding device inductor 200 and assembly inductor (e.g., an inductor pair, with the device inductor 200 and the assembly inductor thereof each an "element" of the inductor pair). For example, when a current flows through either and/or both elements of the inductor pair, a corresponding current is induced in the opposing inductor. By implementing the assembly and device communication elements 114, 126 as inductors, the assembly 100 can include communication between the perpendicular stack devices 122 and the assembly device 110 without directly sending a current (e.g., through conductive material) between the stack and assembly devices 122, 110. This can eliminate difficulties associated with forming conductive bonds (e.g., via solder, hybrid bonding, etc.), such as incomplete interconnection, solder voiding, or other similar difficulties.

Characteristics of one or both elements of the inductor pair can be adjusted to improve communication therebetween including, for example, the height (e.g., thickness, distance, measure) of the adhesive 130, the vertical alignment (or misalignment) of the inductor pair, the position of the axis of each element of the inductor pair, the size of each element of the inductor pair, and/or any similar characteristics. For example, the height of the adhesive 130 can be such that when the current flows through either element of the inductor pair, a corresponding current is induced in the opposing inductor with minimal loss. In some embodiments, the adhesive 130 can be 1 µm, 5 µm, 10 µm, 20 µm, 40 µm, 60 µm, 80 µm or 100 µm thick (or any specific value or range outside or therebetween). As a further example, a surface area of the device inductor 200 at the side of the stack device 122 can be equal to, greater than, or less than a surface area of the opposing assembly inductor. For example, the surface area of the device inductor 200 can be twice, three times, four times, or five times greater or smaller (or any specific value or range outside or therebetween) than the surface area of the assembly inductor.

Referencing FIG. 2B, one or more device optical elements 210 can be at the side of the stack device 122. That is, for example, the stack device 122 can include one or more device optical elements 210 laterally spaced along the length of the stack device 122. The device optical elements 210 can include a laser generator 212 (and/or receiver) surrounded by one or more layers of conductive material 214 and/or dielectric material 216. The laser generator 212 can face the side of the stack device 122, and can face the top surface of the assembly device 110 of FIG. 1 (when included in the assembly 100). In some embodiments, one or more of the device optical elements 210 can be at, extending from, or on the top surface of the stack device 122. The device optical elements 210 can be in electric communication with one or more components within the stack device 122 via traces within the stack device 122. In embodiments where the stack device 122 includes one or more bond pads at the top surface thereof, a trace can additionally or alternatively extend along the top surface of the stack device 122 between the device optical elements 210 and one or more of the bond pads.

When the stack devices 122 include the device optical elements 210, one or more assembly communication elements 114 of FIG. 1 corresponding with the device optical elements 210 (e.g., corresponding with the device communication elements 126 of FIG. 1) can be implemented as assembly optical elements. The assembly optical elements, like the device optical elements 210, can each include a laser receiver (and/or generator) surrounded by one or more layers of conductive material and/or dielectric material, and the laser receiver can face the top surface of the assembly device 110 and the corresponding device optical element 210.

The device optical elements 210 can facilitate communication between the stack device 122 and the assembly device 110 via a pair of corresponding device optical element 210 and assembly optical element. (e.g., an optical element pair). For example, either and/or both elements of the optical element pair can send and/or receive information via light signals (e.g., laser signals) to and/or from the opposing element. Further, either and/or both elements of the optical element pair can send and/or receive information via overlapping signals sent at different wavelengths. By implementing the assembly and device communication elements 114, 126 as optical elements, the assembly 100 can include communication between the perpendicular stack devices 122 and the assembly device 110 without directly sending a current (e.g., through conductive material) between the stack and assembly devices 122, 110. This can eliminate difficulties associated with forming conductive bonds (e.g., via solder, hybrid bonding, etc.), such as incomplete interconnection, solder voiding, or other similar difficulties. Further, communication via light signals (versus induction or direct current) can allow for increased signaling capacity because information can be transmitted more quickly (e.g., at the speed of light).

Characteristics of one or both elements of the optical elements pair can be adjusted to improve communication therebetween including, for example, the height and/or opacity of the adhesive 130, the vertical alignment (or misalignment) of the optical element pair, the size of each element of the optical element pair, and/or any similar characteristics. For example, the height and/or opacity of the adhesive 130 can be such that information can be transferred (e.g., light signals can be sent and/or received) between the elements of the optical elements pair. In some embodiments, the adhesive 130 can be 1 µm, 5 µm, 10 µm, 20 µm or 40 µm thick (or any specific value or range outside or therebetween), further the adhesive can be transparent or translucent.

As illustrated in FIG. 2A, the stack device 122 includes five device inductors 200, and as illustrated in FIG. 2B, the stack device 122 includes one device optical element 210. In some embodiments, the stack device 122 can include fewer (e.g., 1, 2, 3, or 4) or more (e.g., 10, 100, 1000, etc., or any specific value or range outside or therebetween) device inductors 200 and/or device optical elements 210. Further, the assembly device 110 of FIG. 1 can include fewer or more corresponding assembly inductors and/or optical elements. For example, the stack device 122 can include at least one device inductor 200 and at least one device optical element 210, and the assembly device 110 can include at least one corresponding assembly inductor and at least one corresponding device optical element 210, respectively. As a further example, the stack device 122 can include at least ten device inductors 200 or device optical elements 210, and the assembly device 110 can include at least ten corresponding assembly inductors or corresponding device optical elements.

The conductive material of the device inductors 200, the device optical elements, the assembly inductors, and/or the assembly optical elements can include any suitable conductive material such as, for example, copper, gold, silver, aluminum, tungsten, cobalt, nickel, or any other suitable conductive material or combination thereof. The device inductors 200, the device optical elements, the assembly inductors, and/or the assembly optical elements can include any suitable dielectric, nonconductive material such as, for example, a polymer, spin on dielectric material, TEOS, SiN, SiO, SiCN, or any other suitable similar material. The conductive and/or dielectric materials of the device inductors 200 and the assembly inductors, or the device optical elements and the assembly optical elements, can be the same or different. For example, the device inductors 200 can include copper conductive material and polymer dielectric material, and the assembly inductors can include silver conductive material and polymer dielectric material.

Figure 3:
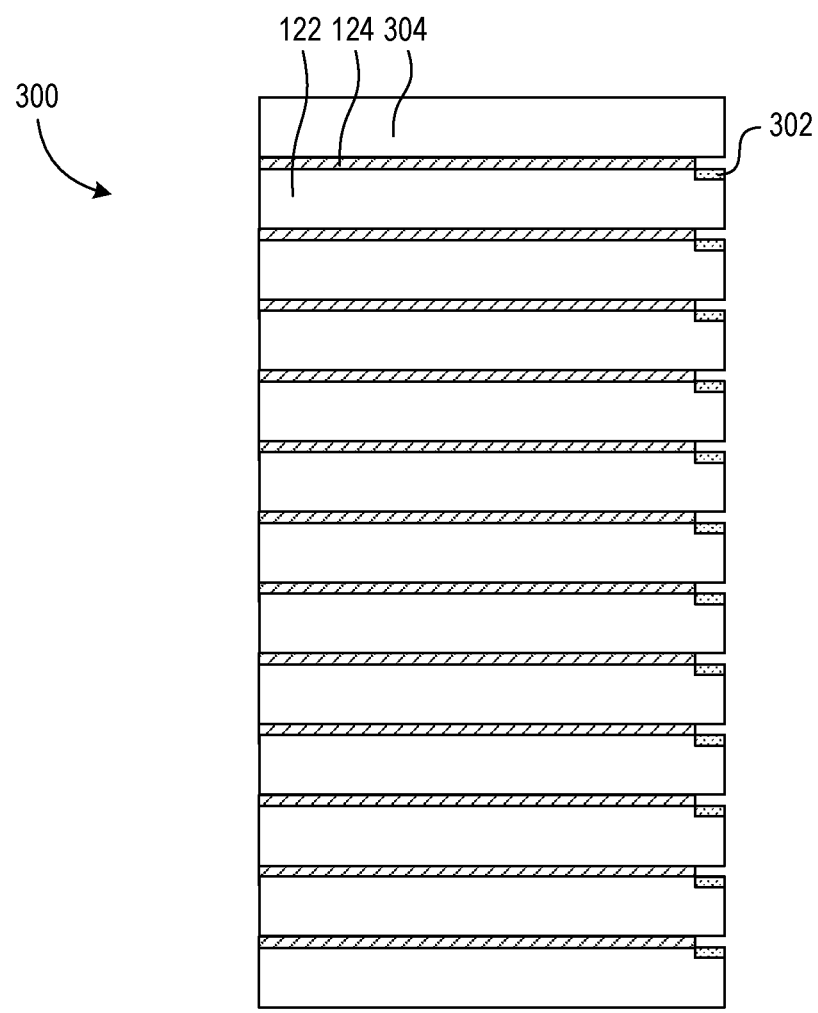
FIG. 3 is a cross-sectional side view of a stack of semiconductor devices, configured in accordance with some embodiments of the present technology.
Figure 4:
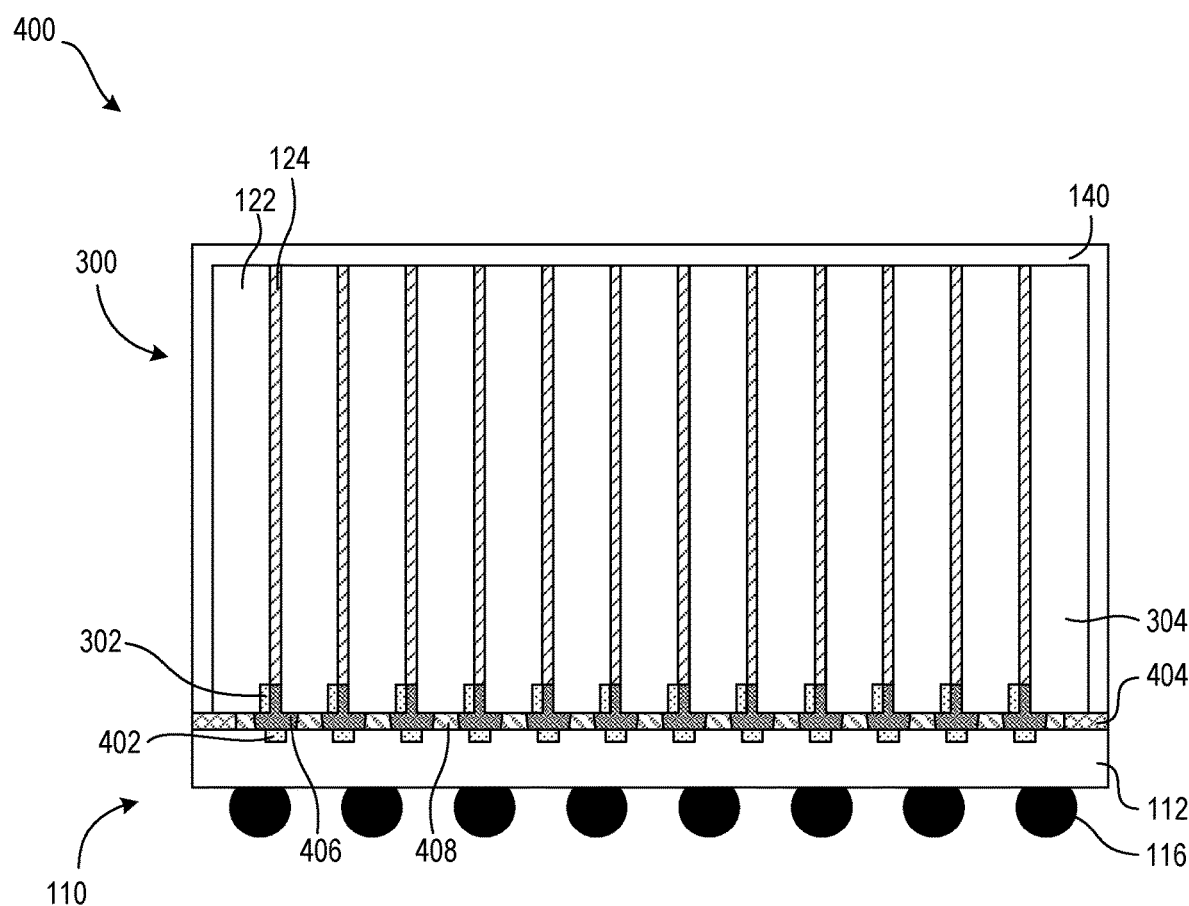
FIG. 4 is a cross-sectional side view of a semiconductor device assembly, configured in accordance with some embodiments of the present technology.

FIGS. 3 and 4 illustrate a second example of a semiconductor device assembly including a perpendicular device stack, configured in accordance with some embodiments of the present technology. More specifically, FIG. 3 is a cross-sectional side view of a device stack 300 with stack devices 122 including device bond pads 302, and FIG. 4 is a cross-sectional side view of a semiconductor device assembly 400 including the device stack 300 electrically and, in part, physically coupled to the assembly device 110 by plated interconnections 406. Elements of the second example, and the device stack 300 of FIG. 3 and the assembly 400 of FIG. 4, can include aspects and provide benefits generally similar to the first example, illustrated in FIGS. 1, 2A, and 2B; the third example, illustrated in FIGS. 5 and 6; and/or the fourth example, illustrated in FIGS. 7 and 8.

Referencing FIG. 3, the device stack 300 can include the stack devices 122 with the adhesives 124 of FIG. 1. Further, one or more of the stack devices 122 can each include the device bond pad 302 implemented as the device communication element 126 of FIG. 1. The device bond pad 302 can be at the top and/or side surfaces of the stack devices 122. The stack device 122 can further include one or more additional device bond pads 302 laterally spaced along a length of the stack device 122. The device stack 300 can further include an end device 304 coupled to an uppermost stack device 122. The end device 304 can be a non-functional (or functional) semiconductor device (e.g., semiconductor die, substrate). The end device 304 can protect the device bond pad 302 opposite therefrom, and can encourage uniform plated interconnection 406 growth across the device stack 300, as discussed in greater detail below regarding FIG. 4.

As illustrated in FIG. 3, the adhesives 124 can be excluded from a portion of the space between the stack devices 122. For example, the adhesives 124 can be excluded from between the stack devices 122, partially or fully exposing the device bond pads 302 and partially exposing the bottom surface of an opposing stack device 122. A portion of one or more of the adhesives 124 can each extend over an inner side (e.g., a left side, as shown) of the corresponding device bond pad 302 by 1 µm, 5 µm, 10 µm, 20 µm 50 µm or 100 µm (or any specific value or range outside or therebetween). Additionally or alternatively, an end (e.g., a right end, as shown) of one or more of the adhesives 124 can each be spaced from the inner side of the corresponding device bond pad 302 by 1 µm, 5 µm, 10 µm, 20 µm 50 µm or 100 µm (or any specific value or range outside or therebetween) exposing a portion of the top surface of the stack device 122.

Referencing FIG. 4, the assembly 400 can include the device stack 300 of FIG. 3 coupled to the assembly device 110 by one or more spacers 404 (e.g., risers, blocks, plugs, shims), one or more of the plated interconnections 406 (e.g., conductive components), and/or an underfill material 408. Further, the device stack 300, the assembly device 110, and/or the components therebetween can be encased by the mold material 140. The assembly device 110 can include assembly bond pads 402 implemented as one or more of the assembly communication elements 114 of FIG. 1, and can include the solder balls 116. In some embodiments, the underfill material 408 can be excluded and a liquid-cooling media for further heat removal. By implanting the assembly and device communication elements 114, 126 as bond pads, and electrically and physically connecting the bond pads with the plated interconnections 406, the acceptance window for positioning the device stack 300 on the assembly device 110 can be greater because the plated interconnections 406 can grow from one or both of a bond pad pair to interconnect each of the stack devices 122 with the assembly device 110. Further, a solder material is not required to form the interconnection.

The spacers 404 can be coupled to the top surface of the assembly device 110 and can extend a distance (e.g., have a height/thickness of 1 µm, 5 µm, 10 µm, 20 µm, 50 µm, 100 µm or any specific value or range outside or therebetween) from the top surface. The spacers 404 can each have a cross-sectional area extending along a length of the assembly device 110 (e.g., into and/or out of the view-plane of FIG. 4). Although as illustrated, the assembly 400 includes two spacers 404, the assembly 400 can include one or more additional spacers 404 laterally spaced from one another along the length of the assembly device 110. For example, the assembly 400 can include 2, 10, 50, or 100 (or any specific value or range outside or therebetween) of the spacers 404 on the left and/or right side of the assembly 400. In some embodiments, the assembly 400 can further include one or more spacers 404 (elongated and/or laterally spaced along the length of the assembly 400) at stack devices 122 between the lowermost stack device 122 and the end device 304.

The spacers 404 can be positioned on the assembly device 110 to correspond with a lowermost stack device 122 (e.g., the left-most stack device 122, as shown) and the end device 304, and can space the device stack 300 (e.g., vertically, as shown) from the top surface of the assembly device 110. Further, one or more of the spacers 404 can be positioned with a portion (or all) of the side surface of the lowermost stack device 122 and of the end device 304 to be at (e.g., resting on, contacting, coupled to) a top surface of the spacers 404. For example, the spacers 404 (on the left and right of the assembly 400) can be elongated along the length of the assembly device 110. The entire side surface (including portions of the device bond pad 302 thereat) of the lowermost stack device 122 and of the end device 304 can contact the top surface of the elongated spacers 404. That is, for example, an inner side of the elongated spacers 404 can be aligned with an inner side of the lowermost stack and end devices 122, 304, respectively.

As a further example, multiple spacers 404 can be spaced (e.g., laterally separated) along the length of the left side of the assembly device 110, and a single, elongated spacer 404 can extend along the length of the right side of the assembly device 110. One or more of the multiple spacers 404 can be positioned with half the side surface of the lowermost stack device 122 contacting the top surface of the one or more of the multiple spacers 404. That is, for example, the inner side of the multiple spacers 404 can align with a centerline of the lowermost stack device 122. Further, the single, elongated spacer 404 can be positioned with the entire side surface of the end device 304 contacting the top surface of the single spacer 404.

As shown in FIG. 4, the assembly 400 includes the plated interconnections 406 physically and electrically coupling the device stack 300 to the assembly device 110. Further, the plated interconnections 406 can facilitate communication between the stack devices 122 and the assembly device 110. The plated interconnections 406 can each extend between one or more surfaces (e.g., top and/or side surfaces) of the corresponding device bond pad 302 and of the corresponding assembly bond pad 402. The plated interconnections 406 can further contact the end of the corresponding adhesive 124 and the corresponding opposing bottom surface of the stack device 122, or the end device 304, and fill the gap therebetween. The plated interconnections 406 can further extend laterally (e.g., to the right and/or left, as shown) from the corresponding assembly bond pad 402 between the device stack 300 and the assembly device 110.

As illustrated in FIG. 4, the stack devices 122 can each include one of the device bond pad 302 and the plated interconnection 406, and the assembly device 110 can include one corresponding assembly bond pad 402. In some embodiments, each of the stack devices 122 can include additional (e.g., 10, 100, 1000, or any specific value or range outside or therebetween) device bond pads 302 and the plated interconnection 406. Further, the assembly device 110 can include additional, corresponding assembly bond pads 402.

The device bond pads 302, the assembly bond pads 402, and the plated interconnections 406 can include any suitable conductive material such as, for example, copper, gold, silver, aluminum, tungsten, cobalt, nickel, or any other suitable conductive material or combination thereof. The spacers 404 can include any suitable dielectric, nonconductive material such as, for example, a polymer, DAF, NCP, NCF, spin on dielectric material, TEOS, SiN, SiO, SiCN, or other suitable similar material.

Figure 5:
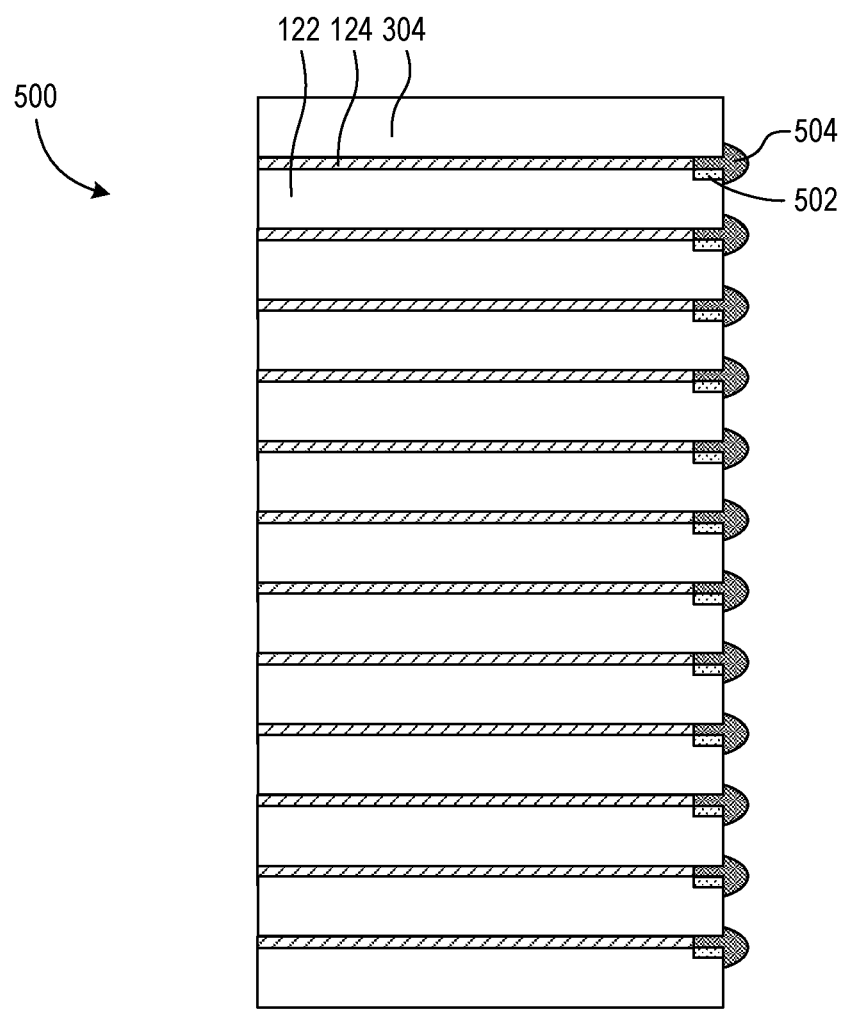
FIG. 5 is a cross-sectional side view of a stack of semiconductor devices, configured in accordance with some embodiments of the present technology.
Figure 6:
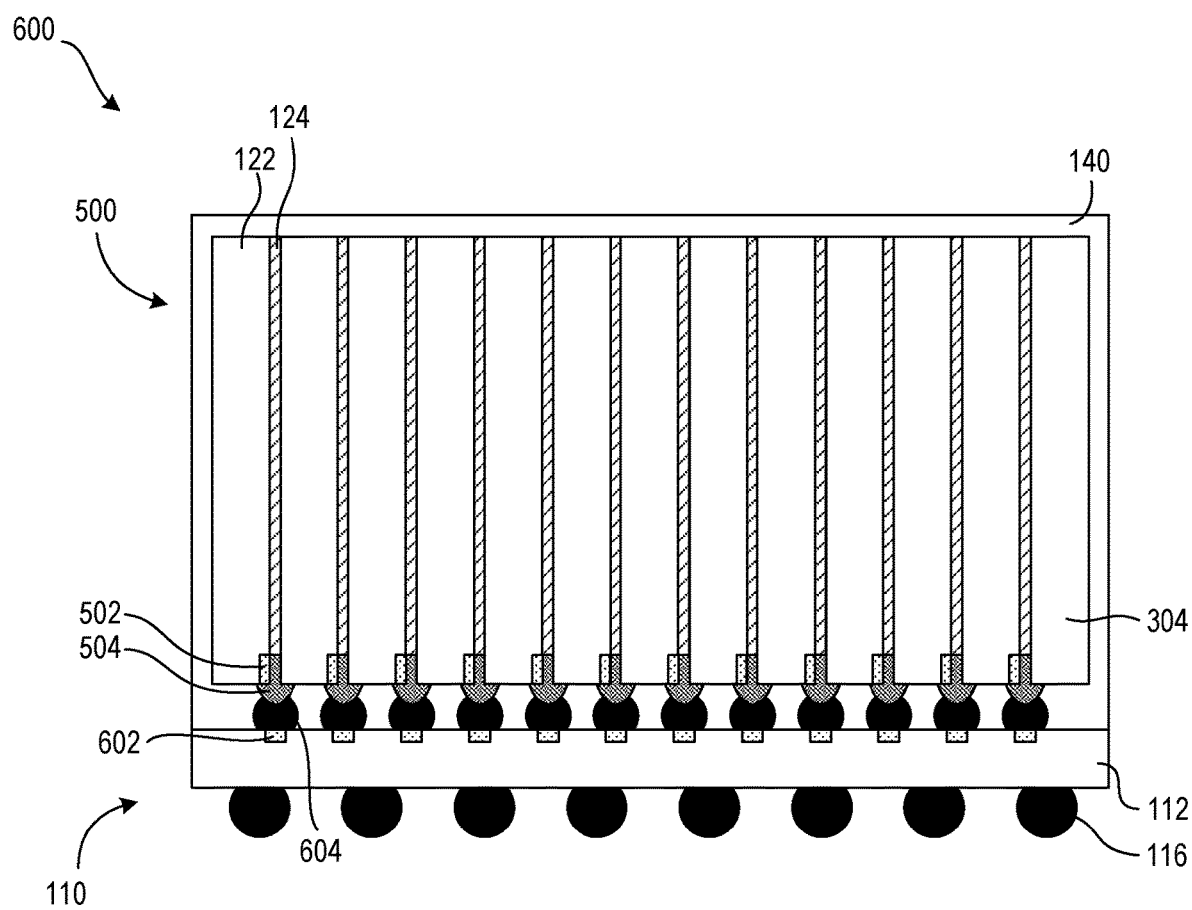
FIG. 6 is a cross-sectional side view of a semiconductor device assembly, configured in accordance with some embodiments of the present technology.

FIGS. 5 and 6 illustrate a third example of a semiconductor device assembly including a perpendicular device stack, configured in accordance with some embodiments of the present technology. More specifically, FIG. 5 is a cross-sectional side view of a device stack 500 with stack devices 122 including device bond pads 502 with plated interconnections 504 extending therefrom. FIG. 6 is a cross-sectional side view of a semiconductor device assembly 600 including the device stack 500 electrically and, in part, physically coupled to the assembly device 110 by interconnection solders 604. Elements of the third example, and the device stack 500 of FIG. 5 and the assembly 600 of FIG. 6, can include aspects and provide benefits generally similar to the first example, illustrated in FIGS. 1, 2A, and 2B; the second example, illustrated in FIGS. 3 and 4; and/or the fourth example, illustrated in FIGS. 7 and 8.

Referencing FIG. 5, the device stack 500 can include the stack devices 122 with the adhesives 124 of FIG. 1, and the end device 304 of FIG. 3. Further, one or more of the stack devices 122 can each include the device bond pad 502 implemented as the device communication element 126 of FIG. 1. The device bond pad 502 can be at the top and/or side surfaces of the stack devices 122, and can include the plated interconnection 504 extending therefrom. The stack device 122 can further include one or more additional device bond pads 502 laterally spaced along a length of the stack devices 122, each with an additional plated interconnection 504 extending therefrom.

As illustrated, the adhesives 124 can be excluded from a portion of the space between the stack devices 122 similar to, or the same as in, the device stack 300 of FIG. 3. Further, the plated interconnections 504 can be similar to the plated interconnections 406 of FIG. 4. The plated interconnections 504 of FIG. 5, however, can each extend from one of the device bond pads 502 as part of the device stack 500 prior to assembly with a semiconductor device assembly (e.g., the assembly 600 of FIG. 6). By including the plated interconnections 504 prior to assembly with the semiconductor device assembly (e.g., as to the assembly 400 of FIG. 4), the device stack 500 can be more easily manipulated for plated interconnection 504 formation. Further, plating can occur on a fully exposed surface, as opposed to within a gap (e.g., like the assembly 400 of FIG. 4).

The plated interconnections 504 can each extend from one or more surfaces of the corresponding device bond pad 502. The plated interconnections 504 can each further contact the end of the corresponding adhesive 124 and the corresponding opposing bottom surface of the stack device 122, or the end device 304, and fill the gap therebetween. The plated interconnections 504 can further extend from (e.g., perpendicular to) and along (e.g., vertically up and/or down, as shown) the right side of the device stack 500. For example, one or more of the plated interconnections 504 can extend 1 µm, 5 µm, 10 µm, 20 µm, 50 µm or 100 µm (or any specific value or range outside or therebetween) from the right side of the device stack. Further, one or more of the plated interconnections 504 can extend 1 µm, 5 µm, 10 µm, 20 µm, 50 µm, or 100 µm (or any specific value or range outside or therebetween) along the right side of the stack device 122 above and/or below the top surface of the corresponding device bond pad 502.

Referencing FIG. 6, the assembly 600 can include the device stack 500 of FIG. 5 coupled to the assembly device 110 by one or more interconnection solders 604 (e.g., solder connections/joints, solder balls, conductive components), with the device stack 500, the assembly device 110, and/or the components therebetween encased by the mold material 140. Further, the assembly device 110 can include assembly bond pads 602, each with an interconnection solder 604 (e.g., a solder ball, solder material) coupled thereto, implemented as one or more of the assembly communication elements 114 of FIG. 1. The assembly 600 can also include the solder balls 116 coupled to the bottom surface of the assembly substrate 112. In some embodiments, prior to coupling, the interconnection solder 604 can additionally or alternatively be included on the plated interconnections 504 of the device stack 500. In some embodiments, the mold material 140 between the device stack 500 and the assembly device 110 can be excluded and mold material or a liquid-cooling media for further heat removal. By implanting the assembly and device communication elements 114, 126 as bond pads, and electrically and physically connecting the bond pads with the plated interconnections 504 and the interconnection solders 604, the perpendicular device stack 500 can be coupled to the assembly device 110 using conventional assembly means.

As shown, the assembly 600 includes the interconnection solders 604 electrically and physically coupling the plated interconnections 504 (and the device stack 500, overall) to the assembly device 110. The interconnection solders 604 can each extend between one or more surfaces of the corresponding device bond pad 502 and the corresponding assembly bond pad 602. Further, an intermetallic material can be at the interface of each corresponding device bond pad 502 and assembly bond pad 602 pair, including portions of each of the pairs.

The device bond pads 502, assembly bond pads 602, and plated interconnections 504 can include any suitable conductive material such as, for example, copper, gold, silver, aluminum, tungsten, cobalt, nickel, or any other suitable conductive material or combination thereof. The interconnection solder 604 can be any suitable solder material configured to physically and electrically connect the device stack 500 with the assembly device 110 by coupling the plated interconnections 504 with the assembly bond pads 602.

Figure 7:
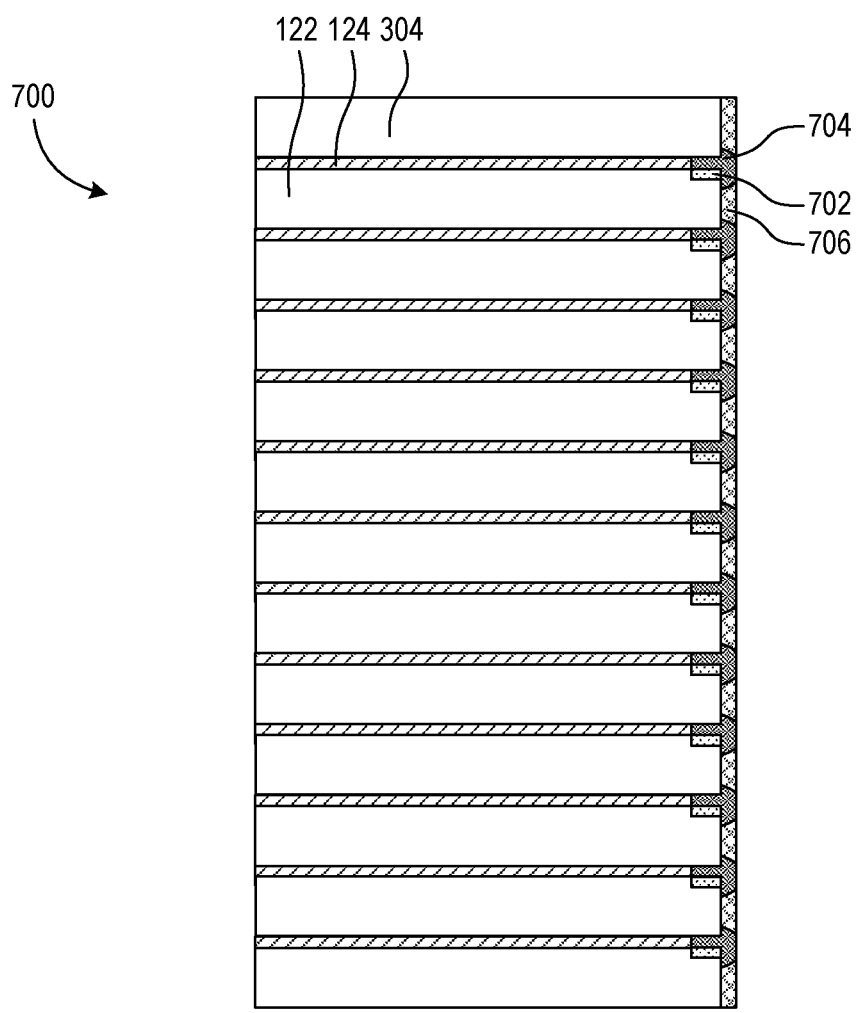
FIG. 7 is a cross-sectional side view of a stack of semiconductor devices, configured in accordance with some embodiments of the present technology.
Figure 8:
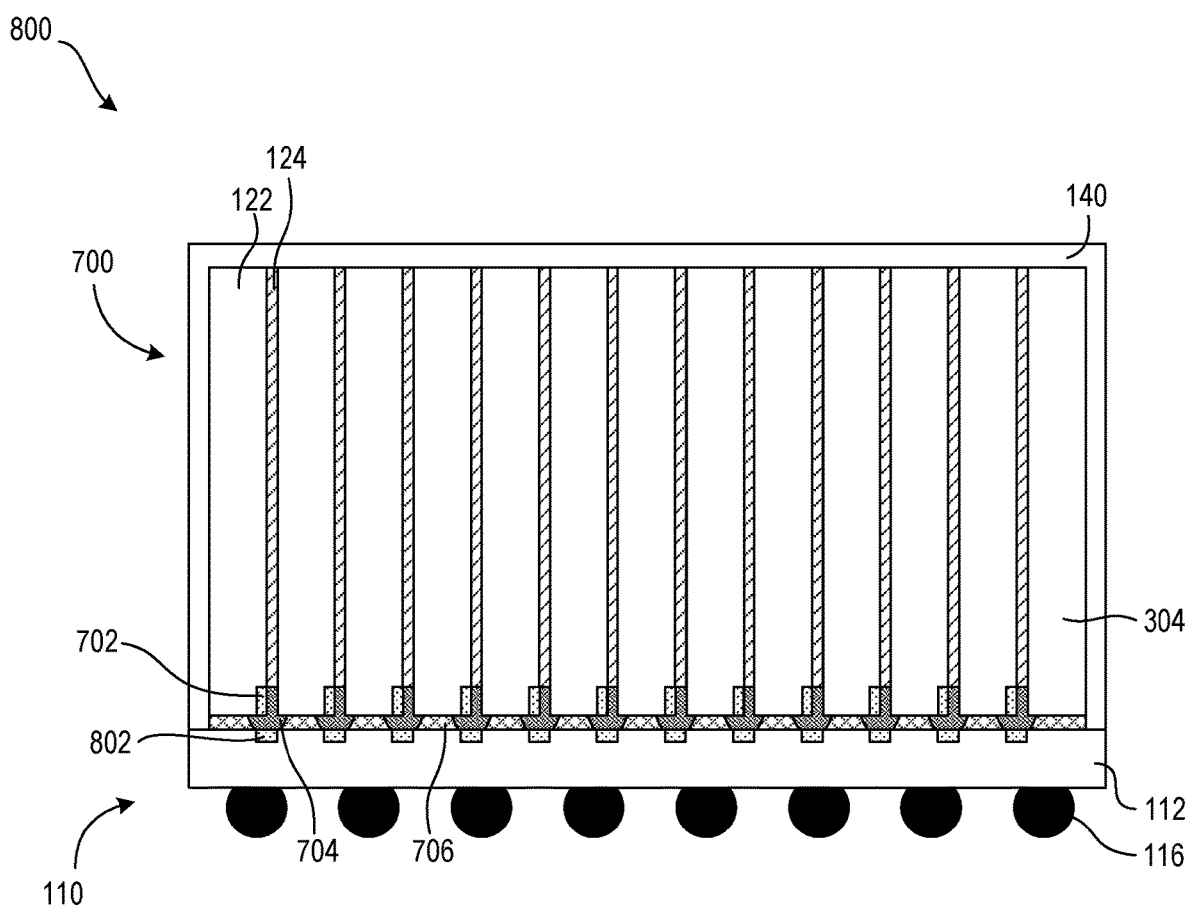
FIG. 8 is a cross-sectional side view of a semiconductor device assembly, configured in accordance with some embodiments of the present technology.

FIGS. 7 and 8 illustrate a fourth example of a semiconductor device assembly including a perpendicular device stack, configured in accordance with some embodiments of the present technology. More specifically, FIG. 7 is a cross-sectional side view of a device stack 700 with a polished (e.g., smoothed, etched, prepared) right surface for hybrid bonding with exposed plated interconnections 704. FIG. 8 is a cross-sectional side view of a semiconductor device assembly 800 including the device stack 700 electrically and physically coupled to the assembly device 110 by hybrid bonding. Elements of the fourth example, and the device stack 700 of FIG. 7 and the assembly 800 of FIG. 8, can include aspects and provide benefits generally similar to the first example, illustrated in FIGS. 1, 2A, and 2B; the second example, illustrated in FIGS. 3 and 4; and/or the third example, illustrated in FIGS. 5 and 6.

Referencing FIG. 7, the device stack 700 can include the stack devices 122 with the adhesives 124 of FIG. 1, and the end device 304 of FIG. 3. Further, one or more of the stack devices 122 can each include the device bond pad 702 implemented as the device communication element 126 of FIG. 1. The device bond pad 702 can be at the top and/or side surfaces of the stack devices 122, and can include the plated interconnection 704 extending therefrom. The stack device 122 can further include one or more additional device bond pads 702 laterally spaced along a length of the stack devices 122, each with an additional plated interconnection 704 extending therefrom. A dielectric layer 706 can extend from the sides (e.g., right sides, as shown) of the stack devices 122 and between the plated interconnections 704.

As illustrated, the adhesives 124 can be excluded from a portion of the space between the stack devices 122 similar to, or the same as in, the device stack 300 of FIG. 3 and/or the device stack 500 of FIG. 5. Further, the plated interconnections 704 can be similar to the plated interconnections 504 of FIGS. 5 and 6. The plated interconnections 704 of FIG. 7, however, can be partially surrounded by the dielectric layer 706 with a portion thereof exposed through the dielectric layer 706 at the right side of the device stack 700. As shown, the exposed portions of the plated interconnections 704 and the dielectric layer 706 can define the polished surface of the device stack 700.

The polished surface can extend from the right sides of the stack devices 122 by 1 µm, 5 µm, 10 µm, 20 µm, 50 µm, 100 µm or any incremental amount greater than, less than, or therebetween. Further, from the left of the of the device stack 700 to the polished surface, or from the right of the stack devices 122 to the polished surface, the device stack 700 (or the plated interconnections 704 and the dielectric layer 706) can have a total thickness variation less than 10 µm, 5 µm, 3 µm or 1 µm or any specific value or range outside or therebetween. Similarly, in some embodiments, from the left of the of the device stack 700 to the polished surface, or from the right of the stack devices 122 to the polished surface, the device stack 700 (or the plated interconnections 704 and the dielectric layer 706) can have a warp of less than 70 µm, 60 µm, 50 µm, 40 µm, 30 µm or 20 µm or any specific value or range outside or therebetween. In some embodiments, the polished surface can have a roughness less than 1 nm, 0.8 nm, 0.6 nm, 0.4 nm, or 0.2 nm, or any specific value or range outside or therebetween. Generally, the total thickness variation, roughness, and/or warp of the devices stack 700 can be sufficiently flat for hybrid bonding between the device stack 700 and the assembly device 110 of FIG. 8.

Referencing FIG. 8, the assembly 800 can include the device stack 700 of FIG. 7 hybrid bonded to the top surface of the assembly device 110, with the device stack 500 and the assembly device 110 encased by the mold material 140. Further, the assembly device 110 can include assembly bond pads 802 implemented as the assembly communication elements 114 of FIG. 1, each physically and electrically coupled to the exposed portion of a corresponding plated interconnection 704 (e.g., conductive components). The assembly 800 can also include the solder balls 116 coupled to the bottom surface of the assembly substrate 112. As shown, the assembly substrate 112 and the assembly bond pads 802 can define the top surface of the assembly device 110.

The assembly device 110 (at the top surface) can have a total thickness variation less than 10 µm, 5 µm, 3 µm or 1 µm or any specific value or range outside or therebetween. Similarly, in some embodiments, the assembly device 110 can have a warp of less than 70 µm, 60 µm, 50 µm, 40 µm, 30 µm or 20 µm or any specific value or range outside or therebetween. In some embodiments, the top surface can have a roughness less than 1 nm, 0.8 nm, 0.6 nm, 0.4 nm, or 0.2 nm, or any specific value or range outside or therebetween. Generally, the total thickness variation, roughness, and/or warp of the assembly device can be sufficiently flat for hybrid bonding between the device stack 700 and the assembly device 110 of FIG. 8.

The polished surface of the device stack 700 can be hybrid bonded with the top surface of the assembly device 110, with the exposed portions of the plated interconnections 704 vertically aligned with and bonded to the assembly bond pads 802. By implementing the assembly and device communication elements 114, 126 as bond pads, and electrically and physically connecting the device stack 700 with the assembly device 110 via hybrid bonding, coupling the device stack 700 to the assembly device 110 can merely require physically contacting the polished surfaces thereof. Therefore, no additional formation or coupling operations are needed, and solder material can be excluded.

In some embodiments, a surface area of one or more of the exposed portions of the plated interconnections 704 can each be equal to, greater than, or less than a surface area of the corresponding assembly bond pad 802. For example, the surface area of one or more of the exposed portions can be twice, three times, four times, or five times greater or smaller (or any specific value or range outside or therebetween) than the surface area of the corresponding assembly bond pad 802. In embodiments where surface area of the exposed portions and the corresponding assembly bond pad 802 vary, portions of the dielectric layer 706 and/or the plated interconnections 704 can also bond with the corresponding assembly bond pad 802 or the assembly substrate 112, respectively. For example, the dielectric layer 706 can be bonded to the assembly substrate 112 and the assembly bond pads 802, or the plated interconnections 704 can be bonded to the assembly bond pads 802 and the assembly substrate 112.

FIGS. 9 through 12 are flow diagrams illustrating processes for producing at least the first through the fourth examples, respectively, of semiconductor device assemblies including a perpendicular semiconductor device, in accordance with embodiments of the present technology. The operations of the processes illustrated in FIGS. 9 through 12 are intended for illustrative purposes and are non-limiting. In some embodiments, for example, the processes can be accomplished with one or more additional operations not described, without one or more of the operations described, or with operations described and/or not described in an alternative order.

Generally, the processes of FIGS. 9 through 12 can include: (i) providing a plurality of stack semiconductor dies with a die communication element at a side of the stack dies; (ii) forming a semiconductor die stack using the stack semiconductor dies, with the die communication elements at a first side of the semiconductor die stack; (iii) providing an assembly semiconductor die with assembly communication elements at a top surface; (iv) positioning the semiconductor die stack with the die communication elements and the assembly communication elements in vertical alignment; and (v) coupling the semiconductor die stack to the assembly semiconductor die, placing the stack semiconductor dies in communication with the assembly semiconductor die via the communication elements. In some embodiments, the processes of FIGS. 9 through 12 can further include: (i) forming the semiconductor die stack with an end semiconductor die, (ii) providing an underfill material between the semiconductor die stack and the assembly semiconductor die, (iii) providing a molding material over the semiconductor die stack and/or the assembly semiconductor die, and/or (iv) forming solder balls on a bottom surface of the assembly semiconductor die.

FIG. 9 is a flow diagram illustrating a process 900 for producing at least the first example of a semiconductor device assembly including perpendicular semiconductor devices, in accordance with embodiments of the present technology. The first example can include communication elements of the assembly implemented as inductors or as optical elements, such as in the assembly 100 of FIG. 1.

Generally, the process 900 can include: (i) providing a plurality of stack semiconductor dies with a die communication element at a side of each of the stack dies (process portion 902); (ii) forming a semiconductor die stack using the stack semiconductor dies, with the die communication elements at a first side of the semiconductor die stack (process portion 904); (iii) positioning the semiconductor die stack with the die communication elements aligned with assembly communication elements of an assembly semiconductor die (process portion 906); and (iv) coupling the semiconductor die stack to the assembly semiconductor die, placing the stack semiconductor dies in communication with the assembly semiconductor die via the communication elements (process portion 908).

Providing the plurality of stack semiconductor dies with the die communication element at the side of each of the stack dies (process portion 902) can include forming a semiconductor wafer with one or more of the stack semiconductor dies therein, and singulating the stack semiconductor dies from the semiconductor wafer. Forming a semiconductor wafer can include using any suitable additive manufacturing process such as, for example, sputtering, physical vapor deposition (PVD), electroplating, lithography, or any other similar process(es). Further, forming a semiconductor wafer can also include masking (e.g., dielectric, photoresist material) and/or etching processes intermixed with the additive processes to form components on or within the wafer. When the semiconductor wafer is formed, the die communication elements of the to-be-singulated stack semiconductor dies can be at or extending over a path where the wafer will be singulated, and/or at a top surface of the wafer. Singulating the stack semiconductor dies can include singulating the semiconductor wafer using any suitable method such as, for example, plasma dicing, laser stealth dicing, mechanical cutting or scoring, or any similar method.

Forming the semiconductor die stack using the stack semiconductor dies, with the die communication elements at the first side of the semiconductor die stack (process portion 904), can include consecutively coupling the provided stack semiconductor dies together with the communication elements of the stack semiconductor dies positioned on the same side (e.g., a first side) of the semiconductor die stack. Consecutively coupling the provided stack semiconductor dies together can include coupling a bottom of a first intermediary stack semiconductor die to a top of a lowermost stack semiconductor die, with the communication element facing the same direction (e.g., having the sides of the dies with the communication element thereat aligned (e.g., parallel, coplanar)). Subsequent intermediary stack semiconductor dies can then be coupled to the first intermediary stack semiconductor die, or a preceding intermediary stack semiconductor die, and an uppermost stack semiconductor die can be coupled to a last intermediary stack semiconductor die. The subsequent intermediary and uppermost stack semiconductor dies similarly can have the communication elements thereof facing the same direction as the communication elements of the lowermost stack semiconductor die.

One or more of the intermediary and/or the uppermost stack semiconductor dies can be coupled to the preceding stack semiconductor die using any suitable coupling method such as, for example, an adhesive (e.g., DAF), solder bonding, hybrid bonding, surface bonding, or any similar method. One or more of the intermediary and/or the uppermost stack semiconductor dies can be coupled to the preceding stack semiconductor die using the same or a different method than one used between one or more other stack semiconductor dies. In some embodiments, an etching, cutting, and/or polishing operation can be performed on the first side of the semiconductor die stack to expose one or more of the die communication elements, and/or to align the sides of the stack semiconductor dies for a uniform first side of the semiconductor device stack.

Positioning the semiconductor die stack with the die communication elements aligned with the assembly communication elements (process portion 906) can include manipulating, moving, rotating, reorienting, or otherwise positioning the semiconductor die stack with the first side facing the top surface of the assembly semiconductor die. The assembly semiconductor die can include a corresponding assembly communication element (e.g., assembly bond pads) for each of the die communication elements. The assembly communication elements can be at the top surface of the assembly semiconductor die. Positioning the semiconductor die can include carrying the semiconductor die stack with a manipulator and suspending the first side over the top surface of the assembly semiconductor die with the die and assembly communication elements aligned. In some embodiments, the assembly semiconductor die can instead be carried by the manipulator and aligned with the semiconductor die stack.

Coupling the semiconductor die stack to the assembly semiconductor die (process portion 908) can include applying an adhesive and bonding the assembly semiconductor die and the first side of the semiconductor die stack together. Applying an adhesive can include spraying, depositing, and/or laying an adhesive material and/or DAF to/on the top surface of the assembly semiconductor die and/or the first side of the semiconductor die stack. The top surface and the first side can then be bonded together using pressure, heat, and/or an adhesive curing process. In some embodiments, the adhesive can be applied prior to positioning the semiconductor die stack (e.g., before process portion 906). With the assembly semiconductor die bonded to the semiconductor die stack, and with the die and assembly communication elements aligned, the stack semiconductor dies can communicate with the assembly semiconductor die via the communication elements (e.g., inductors or optical elements).

FIG. 10 is a flow diagram illustrating a process 1000 for producing at least the second example of a semiconductor device assembly including perpendicular semiconductor devices, in accordance with embodiments of the present technology. The second example can include communication elements of the assembly implemented as bond pads, such as in the assembly 400 of FIG. 4. Generally, the process 1000 can include: (i) providing a plurality of stack semiconductor dies with a die communication element at a side of each of the stack dies (process portion 1002); (ii) forming a semiconductor die stack using the stack semiconductor dies, with the die communication elements at a first side of the semiconductor die stack (process portion 1004); (iii) positioning the semiconductor die stack on risers with the die communication elements aligned with assembly communication elements of an assembly semiconductor die (process portion 1006); and (iv) coupling the semiconductor die stack to the assembly semiconductor die, placing the stack semiconductor dies in communication with the assembly semiconductor die via the communication elements (process portion 1008).

Providing the plurality of stack semiconductor dies with the die communication element at the side of each of the stack dies (process portion 1002) can include the same process as providing the plurality of stack semiconductor dies for the process 900 of FIG. 9 (e.g., process portion 902).

Forming the semiconductor die stack using the stack semiconductor dies, with the die communication elements at the first side of the semiconductor die stack (process portion 1004), can include consecutively coupling the provided stack semiconductor dies together with the communication elements of the stack semiconductor dies positioned on the same side (e.g., a first side) of the semiconductor die stack. Further, during forming, material can be excluded (or removed) from between stack semiconductor dies to expose the die communication elements.

Consecutively coupling the provided stack semiconductor dies together can include coupling a bottom of a first intermediary stack semiconductor die to a top of a lowermost stack semiconductor die, with the communication element facing the same direction (e.g., having the sides of the dies with the communication element thereat aligned (e.g., parallel, coplanar)). Subsequent intermediary stack semiconductor dies can then be coupled to the first intermediary stack semiconductor die, or a preceding intermediary stack semiconductor die, and an uppermost stack semiconductor die can be coupled to a last intermediary stack semiconductor die. The die communication element of each of the intermediary and the uppermost die can face the same direction as the die communication element of the lowermost stack semiconductor die. Finally, a bottom surface of an end stack semiconductor (e.g., the end device 304 of FIG. 3) can be coupled to the top surface of the uppermost stack semiconductor die, with the sides of the end stack semiconductor die aligned with the sides of the uppermost stack semiconductor die.

One or more of the intermediary, the uppermost, and/or the end stack semiconductor dies can be coupled to the preceding stack semiconductor die using any suitable coupling method such as, for example, an adhesive (e.g., DAF), solder bonding, hybrid bonding, surface bonding, or any similar method. Material from coupling stack semiconductor dies together can be excluded (or removed) between the dies and over the die communication elements to expose the die communication elements. One or more of the intermediary, the uppermost, and/or the end stack semiconductor dies can be coupled to the preceding stack semiconductor die using the same or a different method than one used between one or more other stack semiconductor dies of the semiconductor die stack. In some embodiments, an etching, cutting, and/or polishing operation can be performed on the first side of the semiconductor die stack to expose one or more of the die communication elements, and/or to align the sides of the stack semiconductor dies for a uniform first side of the semiconductor die stack.

Positioning the semiconductor die stack on the risers with the die communication elements aligned with the assembly communication elements (process portion 1006) can include manipulating, moving, rotating, reorienting, or otherwise positioning the semiconductor die stack with the first side facing the top surface of the assembly semiconductor die, and connecting the semiconductor die stack to the risers. The assembly semiconductor die can include a corresponding assembly communication element for each of the die communication elements at the top surface of the assembly semiconductor die. Positioning the semiconductor die stack can include carrying the semiconductor die stack with a manipulator and suspending the first side over the top surface of the assembly semiconductor die with the die and assembly communication elements aligned. In some embodiments, the assembly semiconductor die can instead be carried by the manipulator and aligned with the semiconductor die stack.

Connecting the semiconductor die stack to the risers can include further positioning the semiconductor die stack with at least the lowermost and the end stack semiconductor dies partially (or fully) overlapping with the risers (see the device stack 300 and the spacer 404 of FIG. 4). An adhesive can be applied to the risers (and/or the portions of the lowermost and the end stack semiconductor dies overlapping the risers) and the semiconductor die stack pressed against the risers. In some embodiments, the adhesive can be excluded and the semiconductor die stack can merely be pressed against the risers.

Coupling the semiconductor die stack to the assembly semiconductor die (process portion 1008) can include forming plated interconnections between the die communication elements and the assembly communication elements, as well as providing an underfill material between the semiconductor die stack and the assembly semiconductor die, and around the plated interconnections. Forming the plated interconnections can include using an electroless plating operation to form (e.g., plate, deposit, grow, accumulate) conductive material on the die communication elements, the assembly communication elements, or both. The plating operation can continue until the die and assembly communication elements are in physical and electric communication via the plated interconnections. The plating operation can then stop and the assembly can be cleared of plating solution. The underfill material can then be provided between the semiconductor die stack and the assembly semiconductor die, and around the plated interconnections. With the assembly semiconductor die coupled to the semiconductor die stack via the plated interconnections, the stack semiconductor dies can communicate with the assembly semiconductor die via the communication elements (e.g., die or assembly bond pads).

FIG. 11 is a flow diagram illustrating a process 1100 for producing at least the third example of a semiconductor device assembly including perpendicular semiconductor devices, in accordance with embodiments of the present technology. The third example can include communication elements of the assembly implemented as bond pads with plated interconnections, such as in the assembly 600 of FIG. 6. Generally, the process 1100 can include: (i) providing a plurality of stack semiconductor dies with a die communication element at a side of each of the stack dies (process portion 1102); (ii) forming a semiconductor die stack using the stack semiconductor dies, with the die communication elements at a first side of the semiconductor die stack (process portion 1104); (iii) forming plated interconnections from the die communication elements (process portion 1106); (iv) positioning the semiconductor die stack with the plated interconnections aligned with assembly communication elements of an assembly semiconductor die (process portion 1108); and (v) coupling the semiconductor die stack to the assembly semiconductor die (process portion 1110), placing the stack semiconductor dies in communication with the assembly semiconductor die via the communication elements.

Providing the plurality of stack semiconductor dies with the die communication element at the side of each of the stack dies (process portion 1102) can include the same process as providing the plurality of stack semiconductor dies for the process 900 of FIG. 9 (e.g., process portion 902).

Forming the semiconductor die stack using the stack semiconductor dies, with the die communication elements at the first side of the semiconductor die stack (process portion 1104), can include the same process as forming the semiconductor die stack for the process 1000 of FIG. 10 (e.g., process portion 1004).

Forming plated interconnections from the die communication elements (process portion 1106) can include forming a conductive material on the die communication elements. Forming conductive material can include using a plating operation (e.g., electroplating or electroless) to plate (e.g., deposit, grow, accumulate) the conductive material on the die communication elements. The plating operation can continue until the plated interconnections (i) partially (or fully) fill the gap at the die communication elements, between the elements and the opposing bottom side of the stack semiconductor dies, and/or (ii) extend from the first side of the semiconductor die stack a certain distance (e.g., 1 µm, 5 µm, 10 µm, 20 µm, 50 µm, 100 µm or any specific value outside or therebetween).

Positioning the semiconductor die stack with the plated interconnections aligned with the assembly communication elements (process portion 1108) can include manipulating, moving, rotating, reorienting, or otherwise positioning the semiconductor die stack with the first side facing the top surface of the assembly semiconductor die. The assembly semiconductor die can include a corresponding assembly communication element for each of the die communication elements at the top surface of the assembly semiconductor die. Further, the assembly semiconductor die can include a solder material at each of the assembly communication elements. Additionally or alternatively, the solder material can be provided on the plated interconnections. Positioning the semiconductor die can include carrying the semiconductor die stack with a manipulator and suspending the first side over the top surface of the assembly semiconductor die with the die and assembly communication elements aligned. In some embodiments, the assembly semiconductor die can instead be carried by the manipulator and aligned with the semiconductor die stack.

Coupling the semiconductor die stack to the assembly semiconductor die (process portion 1110) can include contacting the plated interconnections with the solder material and performing a reflow operation. Contacting can include pressing the positioned semiconductor die stack into the solder material at the assembly communication elements (or pressing the assembly semiconductor die into the positioned semiconductor die stack). The reflow operation can include heating the assembly for a solder bond between the die and assembly communication elements, forming a physical and electrical connection therebetween. With the assembly semiconductor die coupled to the semiconductor die stack via the plated interconnections and the solder material, the stack semiconductor dies can communicate with the assembly semiconductor die via the communication elements (e.g., die or assembly bond pads).

FIG. 12 is a flow diagram illustrating a process 1200 for producing at least the fourth example of a semiconductor device assembly including perpendicular semiconductor devices, in accordance with embodiments of the present technology. The fourth example can include communication elements of the assembly implemented as bond pads with plated interconnections hybrid bonded to an assembly semiconductor die, such as in the assembly 800 of FIG. 8. Generally, the process 1200 can include: (i) providing a plurality of stack semiconductor dies with a die communication element at a side of each of the stack dies (process portion 1202); (ii) forming a semiconductor die stack using the stack semiconductor dies, with the die communication elements at a first side of the semiconductor die stack (process portion 1204); (iii) forming plated interconnections from the die communication elements (process portion 1206); (iv) forming a dielectric material on the first side and around the plated interconnections (process portion 1208); (v) removing portions of the dielectric material and the plated interconnections to form a polished surface (process portion 1210); (vi) positioning the semiconductor die stack with the plated interconnections aligned with assembly communication elements of an assembly semiconductor die (process portion 1212); and (vii) coupling the semiconductor die stack to the assembly semiconductor die (process portion 1214), placing the stack semiconductor dies in communication with the assembly semiconductor die via the communication elements.

Providing the plurality of stack semiconductor dies with the die communication element at the side of each of the stack dies (process portion 1202) can include the same process as providing the plurality of stack semiconductor dies for the process 900 of FIG. 9 (e.g., process portion 902).

Forming the semiconductor die stack using the stack semiconductor dies, with the die communication elements at the first side of the semiconductor die stack (process portion 1204), can include the same process as forming the semiconductor die stack for the process 1000 of FIG. 10 (e.g., process portion 1004).

Forming the plated interconnections from the die communication elements (process portion 1206) can include the same process as forming the plated interconnections for the process 1100 of FIG. 11 (e.g., process portion 1106).

Forming the dielectric material on the first side and around the plated interconnections (process portion 1208) can include an additive manufacturing process to form the dielectric material. For example, sputtering, PVD, electroplating, lithography, or any other similar process(es) can be used to form the dielectric material (i) over the sides of the stack semiconductor dies (e.g., at the first side of the semiconductor die stack), (ii) in gaps between stack semiconductor dies (e.g., gaps provided for forming plated interconnections, but unoccupied by the plated interconnections), and/or (iii) around and/or over the plated interconnections. For example, the dielectric material can extend from the first side of the semiconductor die stack with no portion of the plated interconnections extending therethrough.

Removing portions of the dielectric material and the plated interconnections to form the polished surface (process portion 1210) can include a cutting and polishing operation. For example, the dielectric material and the plated interconnections can be cut (e.g., mechanical or laser cutting, etching) using any suitable cutting method to reestablish the first side of the semiconductor die stack as a flat surface with portions of the plated interconnections exposed thereat. The reformed first side can then be polished to form a surface with sufficient planarity for hybrid bonding.

Positioning the semiconductor die stack with the plated interconnections aligned with the assembly communication elements (process portion 1212) can include the same process as positioning the semiconductor die stack for the process 900 of FIG. 9 (e.g., process portion 906). However, the assembly semiconductor die for the process 1200 of FIG. 12 can include a top surface with sufficient planarity for hybrid bonding, and the assembly communication elements can be aligned with the exposed portions of the plated interconnections.

Coupling the semiconductor die stack to the assembly semiconductor die (process portion 1214) can including hybrid bonding the semiconductor die stack to the assembly semiconductor die. Hybrid bonding can include pressing the polished surface of the semiconductor die stack against the top surface of the assembly semiconductor die, allowing bonds to form between the dielectric material and the substrate of the assembly semiconductor die, and between the exposed portions of the plated interconnections and the assembly communication elements. In some embodiments, portions of the dielectric material or the exposed portions of the plated interconnections can also bond with the assembly communication elements or the substrate of the assembly semiconductor die. With the assembly semiconductor die bonded to the semiconductor die stack, and with the die and assembly communication elements aligned, the stack semiconductor dies can communicate with the assembly semiconductor die via the communication elements (e.g., die or assembly bond pads).

Figure 13:
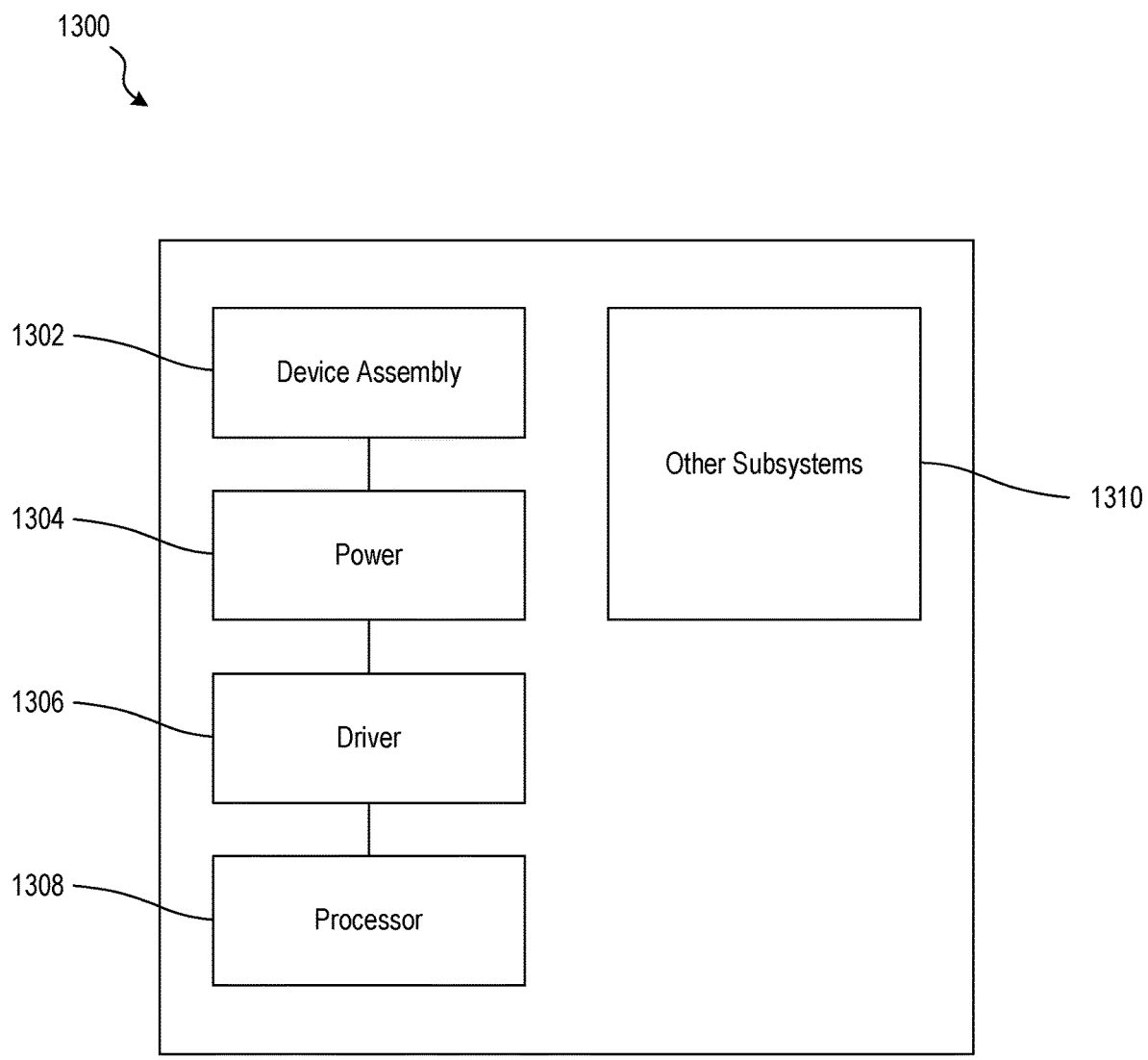
FIG. 13 is a schematic diagram illustrating a semiconductor device assembly incorporating the present technology, configured in accordance with some embodiments of the present technology.

Any one of the semiconductor devices and/or semiconductor device assemblies described above with reference to FIGS. 1-12 can be incorporated into any of a myriad of larger and/or more complex systems, a representative example of which is system 1300 shown schematically in FIG. 13. The system 1300 can include a semiconductor device assembly 1302 (e.g., the assembly 100 of FIG. 1, 400 of FIG. 4, 600 of FIG. 6, 800 of FIG. 8), a power source 1304, a driver 1306, a processor 1308, and/or other subsystems or components 1310. The semiconductor device assembly 1302 can include features generally similar to those of the semiconductor devices and assemblies described above with reference to FIGS. 1-12. The resulting system 1300 can perform any of a wide variety of functions, such as memory storage, data processing, or other suitable functions. Accordingly, representative systems 1300 can include, without limitation, hand-held devices (e.g., mobile phones, tablets, digital readers, and digital audio players), computers, vehicles, appliances, and other products. Components of the system 1300 may be housed in a single unit or distributed over multiple, interconnected units (e.g., through a communications network). The components of the system 1300 can also include remote devices and any of a wide variety of computer-readable media.

From the foregoing, it will be appreciated that specific embodiments of the technology have been described herein for purposes of illustration, but well-known structures and functions have not been shown or described in detail to avoid unnecessarily obscuring the description of the embodiments of the technology. To the extent any material incorporated herein by reference conflicts with the present disclosure, the present disclosure controls. Where the context permits, singular or plural terms may also include the plural or singular term, respectively. The terms "comprising," "including," "having," and "with" are used throughout to mean including at least the recited feature(s) such that any greater number of the same features and/or additional types of other features are not precluded. Similarly, use of the word "some" is defined to mean "at least one" of the relevant features and/or elements.

As used herein, including in the claims, "and/or" as used in a list of items (for example, a list of items prefaced by a phrase such as "at least one of" or "one or more of") indicates an inclusive list such that, for example, a list of at least one of A, B, and/or C means: A or B or C; or AB or AC or BC; or ABC (i.e., A and B and C). As used herein, the terms "vertical," "lateral," "upper," "lower," "above," and "below" can refer to relative directions or positions of features in the semiconductor devices in view of the orientation shown in the figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation. It should be noted that the methods described above describe possible implementations, and that the operations and the steps may be rearranged or otherwise modified and that other implementations are possible. Furthermore, embodiments from two or more of the methods may be combined.

From the foregoing, it will also be appreciated that various modifications may be made without deviating from the disclosure or the technology. For example, one of ordinary skill in the art will understand that various components of the technology can be further divided into subcomponents, or that various components and functions of the technology may be combined and integrated. In addition, certain aspects of the technology described in the context of particular embodiments may also be combined or eliminated in other embodiments. Although advantages associated with certain embodiments of the technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

We claim:

1. A semiconductor device assembly, comprising:
an assembly semiconductor die having a top surface, with a first and a second assembly communication element at the top surface; and
a semiconductor die stack coupled to the assembly semiconductor die at the top surface, the semiconductor die stack including:
a first and a second semiconductor die, the first and the second semiconductor dies each having a top surface perpendicular to the top surface of the assembly semiconductor die,
wherein the first semiconductor die includes a first die communication element (i) aligned with and (ii) configured to directly communicate with the first assembly communication element, and
wherein the second semiconductor die includes a second die communication element (i) aligned with and (ii) configured to directly communicate with the second assembly communication element.

2. The semiconductor device assembly of claim 1, wherein the first die communication element is at a side of the first semiconductor die and the second die communication element is at a side of the second semiconductor die, and wherein the sides of the first and the second semiconductor dies are adjacent to the top surface of the assembly semiconductor die.

3. The semiconductor device assembly of claim 1, wherein the semiconductor die stack is a first semiconductor die stack, wherein the semiconductor device assembly further includes a second semiconductor die stack the same as the first semiconductor die stack, and wherein the second semiconductor die stack is coupled to the assembly semiconductor die at the top surface of the assembly semiconductor die and the top surface of the first and the second semiconductor dies of the second semiconductor die stack are perpendicular to the top surface of the assembly semiconductor die.

4. The semiconductor device assembly of claim 1, wherein the assembly semiconductor die further includes a third assembly communication element, wherein the semiconductor die stack further includes a third semiconductor die having a top surface perpendicular to the top surface of the assembly semiconductor die, and wherein the third semiconductor die includes a third die communication element (i) aligned with and (ii) configured to directly communicate with the third assembly communication element.

5. The semiconductor device assembly of claim 1, wherein the semiconductor die stack is coupled to the assembly semiconductor die by an adhesive.

6. The semiconductor device assembly of claim 1, wherein the semiconductor die stack is coupled to the assembly semiconductor die at least in part by interconnected conductive components between the die and the assembly communication elements.

7. The semiconductor device assembly of claim 1, wherein the first and the second assembly communication elements and the first and the second die communication elements are each an inductor assembly.

8. The semiconductor device assembly of claim 1, wherein the first and the second assembly communication elements and the first and the second die communication elements are each an optical element.

9. The semiconductor device assembly of claim 1, wherein the first and the second assembly communication elements and the first and the second die communication elements are each a bond pad.

10. The semiconductor device assembly of claim 9, wherein a plated interconnection physically and electrically couples the first and the second die communication elements to the first and the second assembly communication elements, respectively.

11. The semiconductor device assembly of claim 9, wherein a plated interconnection and a solder material physically and electrically couple the first and the second die communication elements to the first and the second assembly communication elements, respectively.

12. A semiconductor die, comprising:
a die substrate including a top surface, a side surface perpendicular to the top surface, and a bottom surface parallel to the top surface, wherein an end of the top surface proximate to a side of the die substrate that comprises the side surface is offset from an end of the bottom surface at the side of the die substrate;
a semiconductor component within the die substrate; and
a first communication element exposed at the side surface of the die substrate and in electric communication with the semiconductor component, wherein:
the first communication element comprises a top surface that is coplanar with the top surface of the die substrate and extends horizontally from the end of the top surface of the die substrate to the end of the bottom surface of the die substrate,
the first communication element comprises and a second side surface that is coplanar with the side surface of the die substrate, and
the first communication element is configured to communicate with a corresponding first opposing communication element of a second die substrate.

13. The semiconductor die of claim 12, wherein the first communication element is further exposed at the top surface of the die substrate.

14. The semiconductor die of claim 12 further including a second communication element (i) spaced from the first communication element along the side surface of the die substrate, (ii) exposed at the side surface of the die substrate, and (iii) configured to communicate with a corresponding second opposing communication element.

15. The semiconductor die of claim 12, wherein the first communication element is an inductor.

16. The semiconductor die of claim 12, wherein the first communication element is an optical element.

17. The semiconductor die of claim 12, wherein the first communication element is a bond pad.

18. A method of manufacturing a semiconductor device assembly, comprising:
providing a plurality of stack semiconductor dies with a die communication element at a side of each of the stack semiconductor dies;
forming a semiconductor die stack using the stack semiconductor dies, with the die communication elements at a first side of the semiconductor die stack;
positioning the semiconductor die stack with each of the die communication elements aligned with an assembly communication element at a top surface of an assembly semiconductor die; and
coupling the semiconductor die stack to the assembly semiconductor die, placing each of the die communication elements in direct communication with the assembly communication element aligned therewith.

19. The method of manufacturing of claim 18, wherein coupling further includes extending a plated interconnection from each of the die communication elements and toward the corresponding assembly communication element aligned therewith.

20. The method of manufacturing of claim 18, wherein coupling further includes applying an adhesive to the first side of the semiconductor die stack and/or the top surface of the assembly semiconductor die.

* * * * *